(12) United States Patent
Barford et al.

(10) Patent No.: US 6,691,249 B1
(45) Date of Patent: Feb. 10, 2004

(54) PROBABILISTIC DIAGNOSIS, IN PARTICULAR FOR EMBEDDED AND REMOTE APPLICATIONS

(75) Inventors: Lee A. Barford, San Jose, CA (US); David R. Smith, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/533,115

(22) Filed: Mar. 22, 2000

(51) Int. Cl.[7] ................................................. G06F 11/00
(52) U.S. Cl. .......................... 714/25; 714/26; 714/46; 714/57
(58) Field of Search ......................... 714/25, 26, 37, 714/46, 57

(56) References Cited

U.S. PATENT DOCUMENTS

| 5,099,485 | A |   | 3/1992 | Bruckert et al. |          |
|-----------|---|---|--------|-----------------|----------|
| 5,159,685 | A | * | 10/1992| Kung            | 714/26   |
| 5,337,320 | A | * | 8/1994 | Kung            | 714/26   |
| 5,448,722 | A | * | 9/1995 | Lynne et al.    | 706/49   |
| 5,528,748 | A | * | 6/1996 | Wallace         | 714/25   |
| 5,544,308 | A | * | 8/1996 | Giordano et al. | 714/26   |
| 5,655,074 | A | * | 8/1997 | Rauscher        | 714/38   |
| 5,737,520 | A | * | 4/1998 | Gronlund et al. | 714/39   |
| 5,808,919 | A |   | 9/1998 | Preist et al.   |          |
| 5,922,079 | A | * | 7/1999 | Booth et al.    | 714/26   |
| 6,035,420 | A | * | 3/2000 | Liu et al.      | 714/25   |
| 6,205,559 | B1| * | 3/2001 | Sakaguchi       | 714/25   |
| 6,237,114 | B1| * | 5/2001 | Wookey et al.   | 714/47   |
| 6,430,708 | B1| * | 8/2002 | Evans           | 714/38   |

FOREIGN PATENT DOCUMENTS

EP          0887733       12/1998

* cited by examiner

*Primary Examiner*—Nadeem Iqbal
*Assistant Examiner*—Timothy M Bonura

(57) ABSTRACT

A diagnosis engine for diagnosing a device having a plurality of components receives test results of a set of tests on the device where at least one test has failed, and a model giving the coverage of the tests on the components of the device and information describing probabilistic dependencies between the tests. The diagnosis engine includes a specifier to specify a number N of components that may be simultaneously bad, N being an integer, and a computer to compute, within floating point computation errors, a likelihood that each of subsets of the components having size less than or equal to N are the bad components.

15 Claims, 2 Drawing Sheets

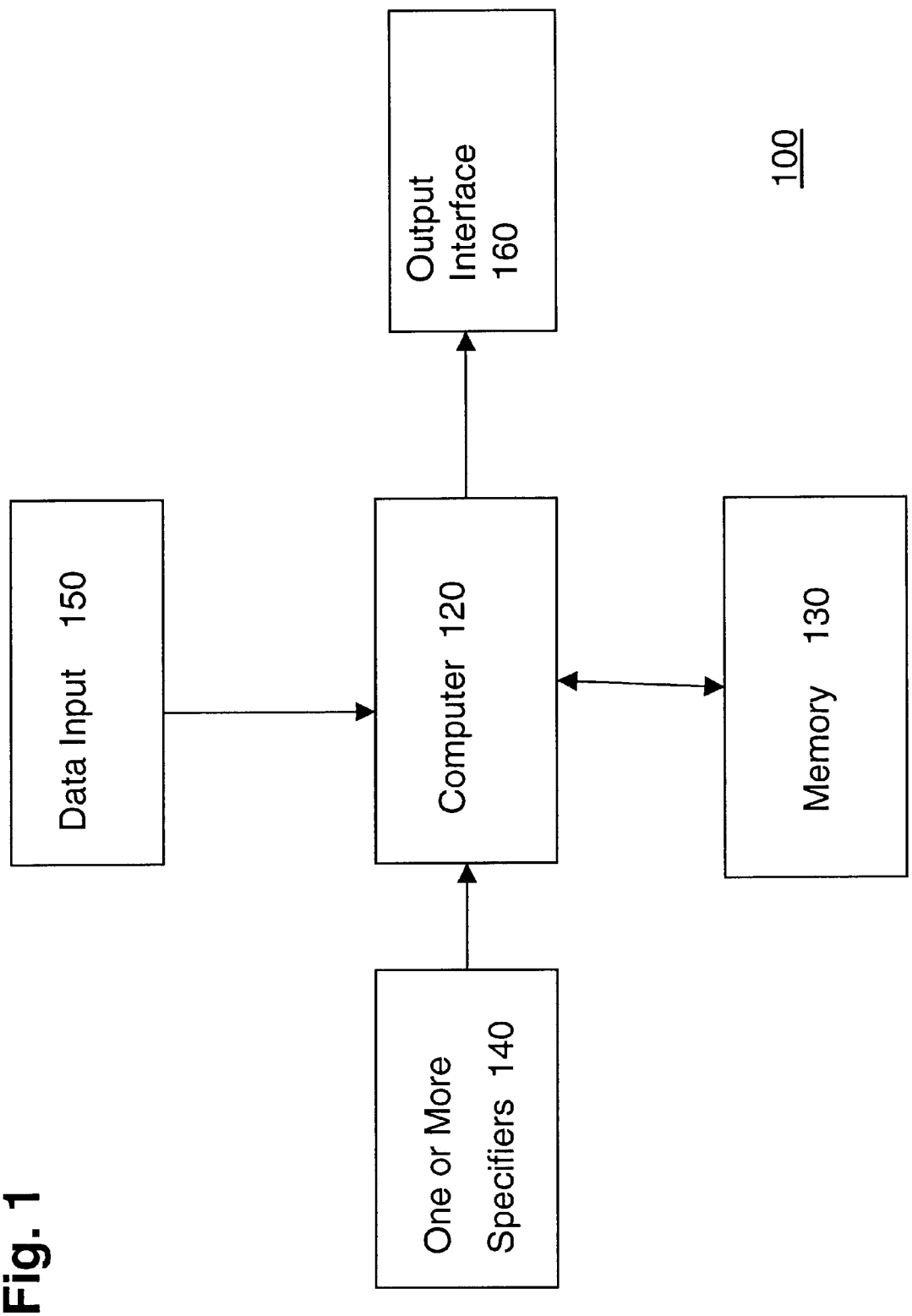

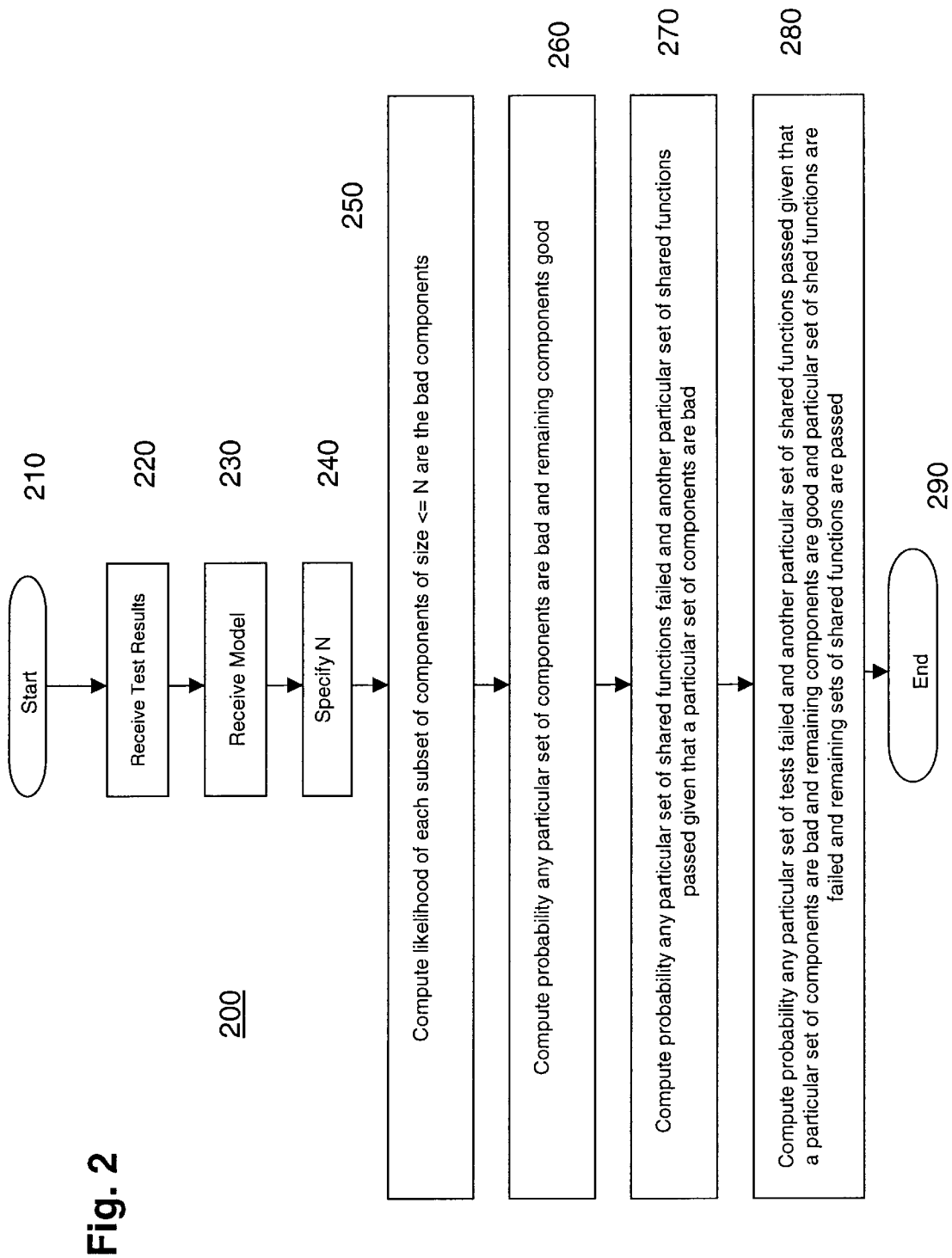

PROBABILISTIC DIAGNOSIS, IN PARTICULAR FOR EMBEDDED AND REMOTE APPLICATIONS

BACKGROUND OF THE INVENTION

The present invention relates to monitoring, detecting, and isolating failures in a system, and in particular to tools applied for analyzing the system.

"To diagnose" means to determine why a malfunctioning device is behaving incorrectly. More formally, to diagnose is to select a subset of a predetermined set of causes responsible for the incorrect behavior. A diagnosis must both explain the incorrect behavior and optimize some objective function, such as probability of correctness or cost of incorrect diagnosis. The need to diagnose is a common reason to measure or to test.

The diagnosis of an engineered device for the purpose of repair or process improvement shall now be regarded. This is in contrast to, say, a distributed computer system containing software objects that may be created or destroyed at any time. It is assumed that the device consists of a finite number of replaceable components. Failures of the device are caused only by having one or more bad components. What shall be called herein "diagnosis" is often called "fault identification". When presented with a failed device, a technician or a computer program (sometimes called a "test executive") will run one or more tests. A technician familiar with the internal workings of a failing device must interpret the test results to identify the bad components.

Expert systems have been used for diagnosing computer failures, as described e.g. by J. A. Kavicky and G. D. Kraft in "An expert system for diagnosing and maintaining the AT&T 3B4000 computer: an architectural description", ACM, 1989. Analysis of data from on-bus diagnosis hardware is described in Fitzgerald, G. L., "Enhance computer fault isolation with a history memory," IEEE, 1980. Fault-tolerant computers have for many years been built with redundant processing and memory elements, data pathways, and built-in monitoring capabilities for determining when to switch off a failing unit and switch to a good, redundant unit (cf. e.g. U.S. Pat. No. 5,099,485).

Prior diagnostic systems for determining likely failed components in a system under test (SUT) include model-based diagnostic systems. A model-based diagnostic system may be defined as a diagnostic system that renders conclusions about the state of the SUT using actual SUT responses from applied tests and an appropriate model of correct or incorrect SUT behavior as inputs to the diagnostic system. Such a diagnostic system is usually based upon computer-generated models of the SUT and its components and the diagnostic process.

Model-based diagnostic systems are known e.g. from W. Hamscher, L. Console, J. de Kleer, in 'Readings in system model-based diagnosis', Morgan Kauffman, 1992. A test-based system model is used by the Hewlett-Packard HP Fault Detective (HPFD) and described in HP Fault Detective User's Guide, Hewlett-Packard Co., 1996.

U.S. Pat. No. 5,808,919 (Preist et al.) discloses a model-based diagnostic system, based on functional tests, in which the modeling burden is greatly reduced. The model disclosed in Preist et al. employs a list of functional tests, a list of components exercised by each functional test along with the degree to which each component is exercised by each functional test, and the historical or estimated a priori failure rate for individual components.

U.S. Pat. No. 5,922,079 (Booth et al.) discloses an automated analysis and troubleshooting system that identifies potential problems with the test suite (ability of the model to detect and discriminate among potential faults), and also identifies probable modeling errors based on incorrect diagnoses.

EP-A-887733 (Kanevsky et al.) discloses a model-based diagnostic system that provides automated tools that enable a selection of one or more next tests to apply to a device under test from among the tests not yet applied based upon a manageable model of the device under test.

In the above three model-based diagnostic systems, a diagnostic engine combines the system-model-based and probabilistic approaches to diagnostics. It takes the results of a suite of tests and computes—based on the system model of the SUT—the most likely to be failed components.

The diagnostic engine can be used with applications where a failing device is to be debugged using a predetermined set of test and measurement equipment to perform tests from a pre-designed set of tests. Using test results received from actual tests executed on the SUT and the system model determined for the SUT, the diagnostic engine computes a list of fault candidates for the components of the SUT. Starting, e.g., from a priori (that is, formed or conceived beforehand) failure probabilities of the components, these probabilities may then be weighted with the model information accordingly if a test passes or fails. At least one test has to fail, otherwise the SUT is assumed to be good.

An embedded processor is a microprocessor or other digital computing circuit that is severely limited in computing power and/or memory size because it is embedded (i.e., built in to) another product. Examples of products typically containing embedded processors include automobiles, trucks, major home appliances, and server class computers (that often contain an embedded maintenance processor in addition to the Central Processing Unit(s)). Embedded processors typically have available several orders of magnitude less memory and an order of magnitude or two less computing power than a desktop personal computer. For example, a megabyte of memory would be a large amount for a home appliance. It is desirable to enable. such an embedded processor in such a product to diagnose failures of the product. A diagnosis engine providing such a capability shall be called an embedded diagnosis engine.

It is possible to perform probabilistic diagnosis by various heuristic methods, as applied by the aforementioned HP Fault Detective product or U.S. Pat. No. 5,808,919 (Preist et al.). Heuristics by nature trade off some accuracy for reduced computation time. However, the HP Fault Detective typically requires 4 to 8 megabytes of memory. This is can be a prohibitive amount for an embedded diagnosis engine.

Another method for solving the problem is Monte Carlo simulation. Although the Monte Carlo simulation method can be made arbitrarily accurate (by increasing the number of simulations), the simulation results must be stored in a database that the diagnosis engine later reads. It has been shown that, even when stored in a space-efficient binary format, this database requires 2–6 megabytes for typical applications. This is too much for an embedded application and would be a burden on a distributed application where the database might have to be uploaded on a computer network for each diagnosis.

A common way of building a probabilistic diagnostic system is to use a Bayesian network (cf. Finn V. Jensen: "Bayesian Networks", Springer Verlag, 1997). A Bayesian network is a directed acyclic graph. Each node in the graph represents a random variable. An edge in the graph represents a probabilistic dependence between two random variables. A source (a node with no in-edges) is independent of all the other random variables and is tagged with its a priori probability. A non-source node is tagged with tables that give probabilities for the value of the node's random variable conditioned on all of the random variables upon which it is dependent.

The computation on Bayesian networks of most use in diagnosis is called belief revision. Suppose values of some of the random variables (in the context of herein, the results of some tests) are observed. A belief revision algorithm computes the most likely probabilities for all the unobserved random variables given the observed ones. Belief revision is NP-hard (cf. M. R. Garey and D. S. Johnson: "Computers and Intractability:

A guide to the theory of NP-completeness", W.H. Freeman and Co., 1979), and so all known algorithms have a worst-case computation time exponential in the number of random variables in the graph.

Bayesian networks used for diagnosis are constructed with random variables and their dependencies representing arbitrary cause-and-effect relationships among observables such as test results, unobservable state of the device under diagnosis and its components, and failure hypotheses. The graph can grow very large and have arbitrary topology. For example, an experimental Bayesian network used by Hewlett-Packard for printer diagnosis has over 2,000 nodes. The complexity of such networks creates two difficulties:

all of the conditional probabilities for non-source nodes must be obtained or estimated, and local changes to topology or conditional probabilities may have difficult-to-understand global effects on diagnostic accuracy.

In other words, the use of a large Bayesian net of arbitrary topology for diagnosis has somewhat the same potential for supportability problems, as do rule-based diagnostic systems.

SUMMARY OF THE INVENTION

It is an object of the invention to provide an improved probabilistic diagnosis that can also be applicable for embedded and/or remote applications.

One aspect of the present invention is to provide a diagnosis engine, that is, a tool that provides automatic assistance, e.g. to a technician, at each stage of a debugging process by identifying components that are most likely to have failed.

A major advantage of the present diagnosis engine over other diagnosis engines is that it can be provided with a small memory footprint: both code and runtime memory requirements are small, growing only linearly with the model size.

The diagnosis engine can be embodied in a program storage device, readable by a machine, containing a program of instructions, readable by the machine and preferably written entirely in Java (cf. e.g. James Gosling, Bill Joy, and Guy Steel: The Java Language Specification, Addison Wesley, 1996) and preferably uses only a few classes from the Java standard language library packages. These features make the present diagnosis engine particularly well suited to embedded and distributed applications.

The present diagnosis engine can be used on applications where a failing device is to be debugged using a predetermined set of test and measurement equipment to perform tests from a pre-designed set of tests. For the purposes of herein, a test is a procedure performed on a device. A test has a finite number of possible outcomes. Many tests have two outcomes: pass and fail. For example, a test for repairing a computer may involve checking to see if a power supply voltage is between 4.9 and 5.1 volts. If the power supply voltage is between 4.9 and 5.1 volts, then the test passes. If the power supply voltage is not between 4.9 and 5.1 volts, then the test fails. Tests may have additional outcomes, called failure modes. For example, a test may involve trying to start an automobile. If the automobile starts, then the test passes. Failure modes might include:

the lights go dim when the key is turned, and there is no noise from under the hood, the lights stay bright when the key is turned, and there is the noise of a single click, the lights stay bright when the key is turned, there is a click, and the starter motor turns, but the engine doesn't turn over, and so forth.

The set of all tests available for debugging a particular device is called that device's test suite. Many applications fit these definitions of debugging and of tests. Examples are:

computer and electronics service and manufacturing rework, servicing products such as automobiles and home appliances, and telephone support fits the model, if we broaden the idea of "test" to include obtaining answers to verbal questions.

Given:

a set of tests on a physical object (e.g., Test 1=pass, Test2=fail, Test 3=pass, etc.) where at least one test has failed, and a model giving the coverage of the tests on the components (e.g., field replaceable units) of the object and information describing probabilistic dependencies between tests, The diagnostic engine in accordance with the present invention outputs a probabilistic diagnosis of the object, that is, a list, each element of which contains:

a list of one or more components, and the likelihood or probability that those components are the bad components. (Likelihood is un-normalized probability. That is, probabilities must sum to one but likelihoods need not.)

Most automated diagnosis systems provide simply a list of possible diagnoses without weighting by probability. Having probabilities is particularly desirable in applications where the number of field replaceable units (FRU) is small. The probabilities also give technicians an opportunity to apply their own expertise.

A diagnosis engine in accordance with the present invention allows handling multiple component failures. No distinction is made between single and multiple faults.

A diagnosis engine in accordance with the present invention can combine the model-based (cf. W. Hamscher, L. Console, and J. de Kleer: Readings in model-based diagnosis, Morgan Kauffman, 1992) and probabilistic approaches to diagnostics.

A diagnosis engine in accordance with the present invention can use the same test-based model as by the aforementioned HP Fault Detective or in U.S. Pat. No. 5,808,919 (Preist et al.). This model describes probabilistic relationships between tests and the components that they test in a manner intended to be accessible to engineers who write tests. Features of this model can be preferably:

- a two-level part-whole hierarchy: names of components (field-replaceable units) and of their sub-components,
- estimates of a priori failure probabilities of the components,
- the names of the tests in the test suite,
- an estimate of the coverage that each test has on each component, i.e., the proportion of the functionality of the component that is exercised by the test, or more formally, the conditional probability that the test will fail given that the component is bad,
- shared coverages of tests, that are a way of modeling tests that are dependent because they test the functionality of some components in exactly the same way (for example, two tests that access a certain component through a common cable have shared coverage on the cable), and
- a way of specifying failure modes for tests in addition to pass and fail. Failure modes have a name, and two lists of components or sub-components. The first list, called the acquit list, names the components or sub-components that must have some operable functionality in order for the failure mode to occur. The second list, called the indict list, names the components or sub-components that may be bad if the failure mode occurs. Each entry in the acquit and indict lists also contains an estimate of the amount of functionality of the component that the failure mode exercises.

Models can be created by:

- Using a model-building graphical user interface (GUI) that comes e.g. with the aforementioned HP Fault Detective. The HP Fault Detective model is read by a program that translates it into a simpler form used internally by the invention that can be saved as an ASCII file. The invention can load such a file from a file system, from a URL, or from local memory.
- Writing ASCII test Fault Detective Model (.fdm) files, or
- Using a model creation application programming interface (API) in Java.

The model, together with the rules of mathematical logic, enables one to compute the probability that a test will fail if a particular component is known to be bad. More details about these models and the model-building process are disclosed in the co-pending US patent application (Applicant's internal reference number: US 20-99-0042) by the same applicant and in U.S. Pat. No. 5,922,079 (Booth et al.). The teaching of the former document with respect to the description of the model and the model-building process are incorporated herein by reference.

A diagnosis engine in accordance with the present invention allows computing the probability of a test's failure when given any pattern of components known to be good or bad. The logic formula known as Bayes' Theorem allows running this computation in reverse. That is, given a particular test result, a diagnosis engine in accordance with the present invention can calculate the probability of occurrence of some particular pattern of component faults and non-faults. A diagnosis engine in accordance with the present invention, can then enumerate all the possible patterns of component faults/non-faults, evaluating the probability of each pattern given the test result. The pattern with highest probability is selected as the diagnosis.

Of course, one test is seldom sufficient to make an unambiguous failure diagnosis. If the test succeeds, it may clear some components, but not indicate the culprit. If the test fails, several components may be indicted, and other tests are required to clear some components or focus suspicion on other components. (Here, "clearing" means to knock the computed fault probability way down, and "focusing suspicion" means to raise the probability to the top or near the top.) Handling multiple test results is easy and quick if the tests are independent of each other. But if the tests are not independent, the problem is much more complex. The dependence is modeled by the shared functions. A case-by-case breakdown must be made of all the ways the shared functions might pass or fail and how they affect the joint probabilities of the test results. Then all these influences must be summed, as sketched e.g. in the outline of a diagnosis algorithm (in pseudo-code) as shown below:

1. For each possible combination of bad components:
   (a) Set sum to 0.
   (b) For each possible pass/fail combination of shared functions:
      i. Compute the probability of the observed test results.
      ii. Add the probability to sum.
   (c) Calculate likelihood of the combination of bad components given sum (using Bayes' Theorem).
2. Sort the fault likelihoods in descending order.

The algorithm iterates over combinations of failed components and computes the conditional likelihood of each combination given passed and failed tests.

Clearly, this method can require enormous amounts of computation as it explores all combinations of shared function outcomes for all combinations of faults.

The mathematical detail how all this is to be accomplished and also how the computational burden is reduced to allow the method to be practical are discussed below in great detail in the section 'Detailed Description of the Invention'.

A Bayesian network can represent any model used by a diagnosis engine in accordance with the present invention. The resulting graph is tripartite, consisting solely of sources, sinks, and one level of internal nodes (as shown later). There is one source for each component. There is one sink for each test. Each shared function is represented by one internal node. However, in order to represent test coverage information, the so-called "Noisy-or" (defined and described in detail in chapter 3 of Finn V. Jensen: "Bayesian Networks", Springer Verlag, 1997) construction must be used. The form of test coverage information is such that the memory-saving technique of divorcing (again, see Chapter 3 of Jensen) cannot be used. This means that the Bayesian network will require an amount of memory exponential in the number of components covered by any test. Even small models exhaust the memory of desktop PC workstations. Clearly this approach is not well suited to embedded or distributed application.

The class of models as applied by the diagnosis engine in accordance with the present invention can be viewed as a subclass of the Bayesian networks. The diagnosis engine in accordance with the present invention can utilize a diagnosis algorithm that can be considered to be an efficient algorithm for belief revision over this subclass. The high accuracy rate of successful diagnosis with the diagnosis engine in accordance with the present invention (as shown later) suggests that this subclass is sufficiently powerful to represent practical diagnosis problems. Furthermore, the relatively structured nature of a model in accordance with the diagnosis engine in accordance with the present invention may be an advantage. when building and supporting a model when compared with free-form construction of a Bayesian network.

Like Bayesian Networks, the diagnosis engine in accordance with the present invention computes the component failure likelihoods exactly. Heuristic methods and Monte Carlo simulation compute approximate likelihoods. The runtime performance of the diagnosis engine in accordance with the present invention is good in practice. It runs about as fast as the aforementioned HP Fault Detective on the same diagnosis problems.

In a nutshell, the diagnosis engine in accordance with present invention is based on the assumptions that:
1. Component states (that is, whether each component is good or bad) are probabilistically independent;
2. Shared function states (that is, whether each shared function is passed or failed) are probabilistically independent given component states; and
3. Test states (that is, whether each test is passed or failed) are probabilistically independent given component and shared function states.

Assumption 1 is used to compute the probability of any particular set of components being bad and all others being good.

Assumption 2 is used to compute the probability of any particular set of shared functions being failed and another particular set of shared functions being passed given that a particular set of components are bad.

Assumption 3 is used to compute the probability of any particular set of tests being failed and another particular set of shared functions being passed given that a particular set of components are bad (and the rest are good) and a particular set of shared functions are failed (and the rest are passed).

Thus, the diagnosis engine in accordance with the present invention:
1. Specifies the component a priori probabilities, coverages, and shared function coverages.
2. Specifies which tests have passed and which tests have failed. (Some tests may be neither passed nor failed because they were never performed.)
3. Specifies how many components may be simultaneously bad. Call this number N, N being a positive integer.
4. Computes the likelihood that each of the subsets of the components with size less than or equal to N comprises the bad components, whereby
    the computation is exact (to within small floating point computation error); and
    the amount of memory required to perform the computation is preferably only a constant amount larger than the memory required to store the inputs and the outputs. ("A constant amount larger" shall mean an increased amount that is the same independent of the model size and N.)
5. Outputs the likelihoods, either
    in human-readable form, or
    as computer data available for further automatic processing.

Instead of feature #3, a default value (e.g.—1 or 2) could be built in. This reduces the flexibility in using the diagnosis engine in accordance with the present invention without impairing its usefulness much.

The diagnosis engine in accordance with the present invention thus requires an amount of memory less than the amount of memory required to store the model and the amount of memory required to store the output multiplied by a small factor that is a constant independent of the model and output sizes. This makes such a diagnosis engine well suited to use as an embedded diagnosis engine.

It is clear that the diagnosis engine in accordance with the present invention can be partly or entirely embodied by one or more suitable software programs, that can be stored on or otherwise provided by any kind of data carrier, and that can be executed in or by any suitable data processing unit. Combinations of hardware and software can also be used.

BRIEF DESCRIPTION OF THE DRAWINGS

FIG. 1 is a block diagram of a diagnosis engine in accordance with an example embodiment of the present invention.

FIG. 2 is a flowchart of the steps performed by the diagnosis engine of FIG. 1.

DETAILED DESCRIPTION OF THE INVENTION

FIG. 1 is a block diagram of a diagnosis engine in accordance with an example embodiment of the present invention. As shown therein, the diagnosis engine 100 includes a computer 120, a memory 130, one or more specifiers 140, a data input 150, and an output interface 160.

The memory 130 stores data inputted by the data input 150 and the data inputted by the one or more specifiers 140. The memory 130 also stores one or more computer programs enabling the computer 120 to perform various functions, including steps enabling the computer 120 to operate as a diagnosis engine in accordance with the present invention.

While only one memory 130 has been shown, one skilled in the art would understand that the memory 130 may in fact include one or more hard drives, floppy disk drives, CD-ROM drives, RAMS, ROMs, or any combination of two or more thereof.

Furthermore, the one or more specifiers 140 serve as data inputs. One skilled in the art would understand that the one or more specifiers 140 and the data input 150 can include manual data input devices, such as a keyboard or a mouse or a touchscreen, or can include data interfaces to receive data in electronic form from other sources.

The output interface 160 can include a visual output, such as a CRT or LCD display screen or can be a data interface to provide data in electronic form to other electronic devices. The output interface 160 can also be a printer to provide a hardcopy output or a CD or floppy disk drive to provide an output contained within a machine-readable data storage medium.

FIG. 2 is a flowchart of the process 200 performed by a diagnosis engine in accordance with an example embodiment of the present invention. As shown therein, process 200 is started during operation 210.

The diagnosis engine receives test results of a set of tests on the device during operation 220. The diagnosis engine then receives a model giving the coverage of tests on the plurality of components of the device and information as to probabilistic dependencies between the tests during operation 230.

A number N of components that may be simultaneously bad is specified by the one or more specifiers 140 during operation 240. One skilled in the art would understand that the choice of N is basically determined by the speed and power of the computer and the memory size. N would normally be specified as 1 or 2 with present-day computer components.

A likelihood that each set of the plurality of components having a size less than or equal to N includes bad components is then computed during operation 250. A probability of any particular set of components being bad and the remaining components being good is then computed during operation 260.

The probability of any particular set of shared functions failed and another particular set of shared functions given that a particular set of components is bad is then computed during operation 270. A probability of any particular set of tests failed and another particular set of shared functions given that a particular set of components are bad and the remaining components are good and a particular set of shared functions are failed and the remaining sets of shared functions are passed is computed during operation 280.

The process 200 ends during operation 290. While no output step has been illustrated, one skilled in the art would understand that the various results of the computations would be stored in the memory 130 of the diagnosis engine and these results can either be automatically outputted or outputted on demand.

Table 1 includes (1) the notation for items from a coverage-based model, such as components, tests, and shared functions, and (2) formal definitions for coverage and shared function variability.

For the sake of simplicity, the term "Equation" is used in the following description for pure mathematical equations and mathematical terms that are not equations but are referenced in this description. The specifically referenced equations in the following description follow Table 2 at the end of this specification.

The components $\phi$ are random variables that can have the states {good, bad}. The a priori probabilities P (c bad) for c $\epsilon\phi$ are given in the model. Component failures are assumed to be independent as defined in Equation (0.1).

Shared functions are used to express probabilistic dependencies between tests. Shared functions may be thought of as expressing the fact that some functionality is checked by different tests in exactly the same way. The shared functions $\Omega$ are random variables with the states {pass, fail}. A shared function s is dependent on the states of the components $\phi$ as shown in Equation (0.2), where the shared function coverages sfcov(s, c) is given in the model. The shared functions are conditionally independent of one another as given in Equation (1).

Intuitively, a shared function fails if it has coverage on a bad spot in any component on which the shared function has coverage. Formally, the probability of a shared function s failing dependent on the states of all components is defined by Equations (2) and (3).

Equation (3) means that the computation can be performed while iterating through a sparse representation of sfcov. Each shared function s has a variability, sfvar(s) between 0 and 1. Intuitively, variability of a shared function says how correlated are the failures of the tests that use the shared function when the shared function is failed. A variability of 0 means that all tests that use the shared function will fail if the shared function fails. A variability of 1 means that tests that use the shared function can fail independently of each other if the shared function fails. In this case, the shared function is being used as a modeling convenience. The notion of shared function variability will be formalized below.

The tests $\psi$ are random variables with the states {pass, fail}. Generally, only some of the tests are performed. Let $\pi$ be the passed tests. Let $\phi$ be the failed tests. A test is dependent on both components and shared functions. The coverages P are defined by Equation (3.1) and given in the model. The shared functions used by a test sfused(t) $\subseteq \Omega$ is also given in the model. Tests are conditionally independent of one another given the states of all components and shared functions as shown in Equation (4).

If a test uses no shared functions, its probability of failure depends on the component states. Intuitively, a test fails if it has coverage on a bad spot. Formally, the probability of a test t failing, when t uses no shared functions, is dependent on the states of all components and is defined by Equations (5) and (6). Equation 6 means that the computer 120 performs the computation by iterating through a sparse representation of cov.

When a test uses shared functions, the test can also fail if any of those shared functions fail. Let us assume Equation (6.1). The conditional probability of test success is then given in Equation (7) and the conditional probability of test failure is its complement as shown by Equation (8).

All probabilistic dependencies between the three sets of random variables $\phi$, $\Omega$, and $\psi$ are given in the aforementioned Equations. Otherwise the random variables are independent. Thus, the dependencies among the random variables could be represented by a Bayesian Network where the sources of the directed acyclic graph (DAG) are the components $\phi$ and the sinks are the tests $\psi$. Each nonzero entry in cov, say cov(t, c), results in an edge from component node c to test node t. Each nonzero entry in sfcov, say sfcov(s, c) results in an edge from component node c to shared function node s. For each element s $\epsilon$ sfused(t) there is an edge from shared function node s to test node t.

Given the above definitions, it is now possible to give the diagnosis algorithm. The algorithm serves to compute and sort posteriori likelihoods of component configurations given test results. Let $\phi \subseteq \psi$ be the passed tests. Let $\phi \subseteq \psi$ be the failed tests. Bayes' Rule gives Equation (9).

All of these conditional probabilities are normalized by the same quantity P $(\pi, \phi)$. This quantity is the a priori probability of the test results and is difficult to compute. So the invention uses the likelihood of Equation (10).

The only nontrivial quantity to compute is P $(\pi, \phi | C, \overline{C})$. If there are no shared functions, this is easy and leads to Equation (11), where P $(\pi | C, \overline{C})$, the probability of the passed tests given the test results, is given in Equations (12)–(14), and P $(\phi | C, \overline{C})$, the probability of the failed tests given the test results, is given in Equations (15) and (16).

If there are shared functions, then use the law of total probability of Equation (17), where the first factor in the summand is in turn a product of factors computed according to Equations (7) and (8) as given in Equation (18).

The conditional probabilities of the shared function states are computed exactly like the test result probabilities of Equation (11) as given in Equations (19)–(21).

Improving Computation Time

Diagnosis could be performed by straightforward evaluation of Equations (10) through (17) for each possible state of the components and shared functions. However, that approach would take $$O(2^{|\phi|+|\Omega|})$$

time, which is unacceptable for most practical applications. According to the invention, techniques for reducing the computation time can be applied, the most important of which are:

reducing the number of candidate diagnoses, i.e., of component states (C, $\overline{C}$) for which posteriori likelihood Equation (10) is computed, and reducing the time required to evaluate Equation (17) by eliminating states of the shared function power set that do not affect the sum.

a) Reducing the Number of Candidate Diagnoses

First, let's consider heuristics for reducing the number of component states. This can be achieved by making a reasonable assumption concerning the maximum number of simultaneously failed components. The invention assumes that component failures are independent. So unless the a priori probabilities of failure are large, multiple failures are rare. This observation suggests choosing a maximum number of simultaneous failures N and computing Equation (10) only for those $C \subseteq \phi$ with $1 \leq |C| \leq N$. This is the strategy preferably used by the invention.

Another strategy is that used by the aforementioned HP FaultDetective, is based on Occam's Razor: postulate only as many failed components as necessary. In other words, take N=1 and compute the likelihoods. If any likelihood is nonzero, stop. Otherwise, increase N by one and repeat. This way, a set of diagnoses is found with the minimum cardinality necessary to explain the test results. There are two dangers to this approach:

1. In pathological situations where unmodeled dependencies exist between tests, the algorithm may not stop in a reasonable amount of time. This can occur, for example, when a test fixture is set up incorrectly.
2. The Bayesian algorithm produces a nonzero likelihood for a diagnosis if has any chance whatsoever. A likelihood threshold would have to be set, but it is hard to set when the hard-to-determine denominator is being omitted from Equation (9).

This strategy works well with the HP FaultDetective but does not work well with the diagnosis engine in accordance with the present invention invention, because the diagnosis engine in accordance with the present invention can find candidate diagnoses with extremely small likelihoods. Even when $|C|=1$, the diagnosis engine in accordance with the present invention will find some diagnoses with small likelihoods, for example $10^{-50}$ or even $10^{-100}$.

b) Active Shared Functions

Now let us consider the problem of reducing the size of the power set $\kappa(\Omega)$ over which Equation 17 is summed. It is evident that a shared function plays a role in diagnosing only those components over which it has coverage, and only when at least one conducted test makes use of the shared function. Therefore, Equation 17 may be summed over the much smaller power set of Equation (21.1), where $\hat{\Omega}$ is the active shared function set as defined in Equation (22), which uses the provisional active shared function set, which is defined as in Equation (22.1).

The restriction to $\kappa(\hat{\Omega})$ is justified in the Equations because the states of $\kappa(\Omega)$ can be paired relative to any shared function s, so that the members of each pair are identical except for s passing in one and failing in the other. If s is not used by any test in $(\pi \cup \phi)$, then Equation (22.2) is invariant for the pair, and the sum of Equation (22.3) yields the probability of the other components of the state. So summing the pairs causes s to drop out of for the purposes of Equation (17).

As for the restriction of $\hat{\Omega}$, consider Equation (20). If a shared function $s \in \sigma$ has no coverage on any presumed faulty component $c \in C$, then sfcov(s, c) is uniformly zero, implying that the innermost product in Equation (20) is 1 for that s. This forces a factor of zero in the outermost product, making Equation (22.4). That result backs through Equation (19) into Equation (17), making the whole term zero. Thus, no state term need be evaluated which posits failure for such a shared function. And again, if a state posits that the shared function succeed, it will simply cause a "1" to be factored into the product of Equation (21). So there is no reason to include that shared function in the state over which Equation (17) is summed.

The provisional active shared function set $\Omega$ can be quickly computed once at the beginning, of the diagnosis, since it depends only on the tests that have been conducted. If the conducted tests are few relative to the available tests, this can effect a considerable reduction in the number of shared functions under consideration. The active shared function set $\hat{\Omega}$ is winnowed from this separately for each combination of faulty components to be evaluated. Limiting the number of simultaneous faults to be considered (cf. above) usually produces a major reduction in the size of this set.

Some examples with the number of active shared functions for different models are shown in Table 2. The first four columns of the table give the name of the model, and the number of components, tests, and shared functions in the model. Column 5 shows the maximum number of active shared functions for which the state has been observed to be expanded. That many active shared functions are not always encountered. Column 7 gives the average size of the power set over which Equation 17 is expanded, which is the average of $$2^{\#active\ SFs}.$$

This is the computational time factor paid for handling the shared functions. Column 6 is the base-2 log of column 7, giving the effective "average" number of active shared functions. The Boise data set is for a disk drive controller board, and Lynx3 is a board from a PC. The observed figures for them were derived over many runs of actual test results, and the effective average SF figures were almost always the same to the second decimal. Cofxhfdf is a model of a spectrum monitoring system, a small building full of radios, measurement equipment, and the cabling between them. The figures in the table were derived by arbitrarily having the first 30 tests fail and the next 30 tests pass. This is an artificial test result, but such large numbers of test failures do occur for the spectrum monitoring system. The result is encouraging, for the expansion factor of 5.85 is nowhere near $2^{203}$. Running that diagnosis took 7.9 seconds of real time on a 200 MHz Pentium Pro computer, which includes the time for loading and starting the program, and reading in the model. The program is written in Java.

c) Short Circuiting

The first product of Equation (18) can be zero if a passed test with 100% coverage clears an assumed bad component. It is actually bad form for a model to claim 100% coverage, so it may not be worthwhile to check for this. A more interesting case is that a term of the second product is zero. This means that no assumed-bad component could have caused one of the failed tests to fail. It is worth checking for this condition to avoid needless processing.

d) Factoring

The first factor in the sum of Equation (17) is a product according to Equation (18); computer 120 computes the first product of equation (18) according to Equation (7). This in turn contains the factor of Equation (22.5), which is invariant over all the terms of the sum, and can therefore be pulled out of the loop.

e) Miscellaneous

The above speedups reduce the order of complexity of the algorithm. Other programming techniques also serve to reduce the required processing time. For example, coverages of failed tests must be matched against failed components. This goes faster if components, tests, and coverages are kept sorted. Bitmaps can be used to compute set intersections or unions, as for winnowing out the active shared function set. But the active shared function set should be kept in a squeezed representation for enumerating all of its states. It is well to pre-allocate arrays where possible, to avoid allocating them and freeing them during execution.

Conclusions

It will be apparent to those skilled in the art from the detailed description and the following procedures that a diagnosis engine constructed according to the present invention will require an amount of memory less than the amount of memory required to store the model and the amount of memory required to store the output multiplied by a small factor that is a constant independent of the model and output sizes. This makes such a diagnosis engine well suited to use as an embedded diagnosis engine.

The effect of obtaining the low memory consumption comes from using equations used to exactly compute the conditional likelihood of the component failures given the test results. Using the above equation numbering, this would be Equation 10 that contains values that must be computed from Equation 17 (that in turn uses Equation 18, that in turn uses Equations 19, 20, and 21) and the independence equation (0.1). However, it is clear that the content of those equations can be expressed also by other equations without departing from the scope of the present invention.

The computer requires only a small memory to compute the diagnosis and to store the model as well as the output. For better illustration, what additional memory is needed to compute the diagnosis is identified below. The effect of low memory usage comes from the features that use that additional memory.

The computer 120 computes the values of the left-hand sides of these equations 10 and 17–21 from the right hand sides without requiring the storage of any intermediate results other than:

a floating point register or memory location to accumulate the sum in Equation 17, a floating point register or memory location to accumulate the products in Equation 18, two floating point registers or memory locations to accumulate the products in Equation 20, one floating point register of memory location to accumulate the products in Equation 21.

Hence, computer 120 includes at least four floating-point registers or responds to four memory locations in memory 130 to calculate equations 10 and 17–21.

In order to improve computation time, the Active Shared Functions (Equation 22) can be applied. An increased amount of memory is needed, however, in order to compute and store the Active Shared Functions. There are two objects that must be stored in memory: the Provisional Active Shared Functions and the Active Shared Functions.

The Provisional Active Shared Functions are normally computed once, typically before the computation is started. The Provisional Active Shared Functions are a subset of the Shared Functions. One way to store the Provisional Active Shared Functions is as an array of integers, where each integer in the array gives the index of a Shared Function that is a Provisional Active Shared Function. So, the Provisional Active Shared Functions can be stored in p integer sized memory locations, where p is the number of Provisional Active Shared Functions, which is less than the number of Shared Functions. The Active Shared Functions change during the course of the diagnosis computation. However, there is only one set of Active Shared Functions at any one time. The Active Shared Functions are a subset of the Provisional Active Shared Functions. So, the Active Shared Functions can be stored in no more integer memory locations than the number of Shared Functions.

The effect of small memory consumption comes from the direct and exact evaluation of statistical equations, such as Equations 10 and 17–21. Computing the values of the left-hand sides of these equations requires only a few floating point registers/memories.

In order for this evaluation to be performed more efficiently, Provisional Active Shared Function and Active Shared Function sets can also be computed. These sets each require no more integer memory locations than the number of Shared Functions in the model. Thus, the number of temporary memory locations needed to compute the diagnosis grows linearly with the number of Shared Functions. To obtain the overall memory requirement, memory to store the model and the output of the diagnosis must also be added.

Illustrative Example

Among searching methods that seek the best of a large number of combinations, there are two principal variants: those that search depth-first, and those that search breadth-first. As a more pictorial example, assumed that the largest apple on a tree is to be found.

For the depth-first search, one goes up the trunk to the first branch and follows that branch. When the first branch divides, one follows the larger subbranch, and so on, each time following the larger subbranch. One eventually, and is to an apple, or to a leaf, or an end of a twig. If it is an apple, its position and size are noted and jotted down on a slate. Then one goes back down to the base of that last branch and explores up the alternative branch. If one ever finds an apple that is bigger than the one noted on the slate, the slate is erased and the position and size of the new apple are noted and recorded. Eventually, the whole tree will have been explored, and the slate never had to record more than one apple's position and size at a time. It has to keep track of where one has been, but that does not take too much memory. All that is required is a list of the form: 1st layer of branches: 3rd alternative; 2nd layer; 2nd alternative; and so on. If the tree has no more than ten layers of branches upon branches upon branches, one will only have to keep a list of ten entries.

It is clear that this procedure requires a certain amount of time. Most likely, the biggest apple is on or near one of the bigger, low-hanging branches. To exploit this, one will do a breadth-first search. The size of the first layer of branches is surveyed. The search is started by looking for apples on the largest branches, and the search for branches is followed by looking for apples. But if the search ever gets so far out in the bushiness that the first branch is smaller than some other branch in the survey, a note of the present location is made and that other branch will be explored. This way, one is always exploring the largest known previously unexamined branch. A note is kept of the biggest apple so far. If one ever comes to a branch that is too small to support an apple of that size, that branch needed not be explored any farther, nor any of its subtwigs. This builds a fast-growing list of branches that one need not come back to, but the reward is that one will always look in the most likely places.

The diagnosis engine in accordance with the present invention thus minimizes the amount of storage required because it does a depth-first search. In order to improve computation time, the invention can apply a breadth-first search (corresponding an application of shared functions) in that it "looks at the tree" and finds that "most of the boughs are dead and barren of leaves and fruit", so it doesn't bother traversing them. Once it is up in the tree, it keeps avoiding dead branches, and ignoring grafted-on branches from orange trees.

Computer Code Examples

The three procedures in the attachments outline in words examples of computer code that could be used to implement the present invention. The first Procedure Diagnose of Attachment (a) gives the method for computing the likelihood of component failures using the speed improvements described in a) and b) of the section 'Improving Computation Time'. Procedure evalDiagnosis of Attachment (b) and Procedure findSfPEsc of Attachment (c) are used by the Procedure Diagnose.

Attachment (a): Procedure Diagnose
  Parameters:
  model
  passed tests array
  failed tests array
  Produces
  list of possible diagnoses, sorted in descending order of likelihood
    1. Generate provisionalActiveSFs, an array of integers. This contains, in ascending order, the identification number of each shared function that is depended on by any test in the passed and failed test arrays.
    2. Create the diagnosis list as an empty set.
    3. for N=1 ... maximum number of simultaneous faults to be considered
      a. for C (the component set) running through all combinations of N faulty components:
        i. Generate activeSFs, an array of integers. This contains the subset of provisionalActiveSFs that depend on any component in C.
        ii. Evaluate the likelihood of C (and only C) being the failed components, by calling evalDiagnosis, giving it C and activeSFs.
        iii. If the likelihood>0, then make an entry in the diagnoses list, containing C and its associated likelihood.
    4. Sort the diagnosis list in order of descending likelihood.
    5. Return the diagnosis list.

Attachment (b): Procedure evalDiagnosis
  Parameters
  model
  passed tests array
  failed tests array
  C, the list of assumed-bad components
  activeSFs, the array of shared functions that both depend on a component in C, and are used by a passed or failed test.
  Produces
  a number giving the likelihood that the pattern of passed and failed tests could have been caused by the failure of all the components in C, and no others.
    1. Call the number of bits in an integer memory location b. If activeSFs has more than b elements, signal an error. (In the preferred embodiment b=32 because the preferred embodiment uses the Java language that uses 32 bit integers.).
    2. Compute Pprior=the a priori probability that all components in C fail while all others succeed. (This is the product of the individual a priori probabilities.)
    3. Compute sfPEscape=an array of numbers with an entry for each shared function, giving the probability that the shared function will pass given bad components C. (See procedure findSfPEsc.)
    4. Set sumprob=0.
    5. for sfPattern=0 to 2^(#active SFs)−1 (We interpret the integer sfPattern as a small array of bits: counting from the right, if bit i is 1, then the i-th active shared function fails. Otherwise, the shared function passes. This is actually shared function number activeSFs.)
      a. Compute PSFPat=the probability of occurrence of this pattern, by multiplying together the separate probabilities of the active shared functions. Those probabilities are:
        i. 1-sfPEscape, if bit i is 1 in sfPattern
        ii. sfPEscape, if bit i is 0 in sfPattern
      b. Compute condPofPassed=probability that all passed tests ought to have passed, given the bad components C and the failed shared functions indicated by sfPattern.
      c. Compute condPofFailed=probability that all failed tests ought to have failed, given the bad components C and the failed shared functions indicated by sfPattern.
      d. Add PSFPat*condPofPassed*condPofFailed to sumProb.
    6. Return Pprior*sumProb.

Attachment (c): Procedure findSfPEsc
  Parameters
  model
  C, an array of assumed-bad components
  activeSFs, an array of active shared functions.
  Produces
  an array of numbers with as many entries as there are shared functions in the model (not just active shared functions), giving the probability that the shared function will pass, given bad components C.
    1. sfPEscape=new numeric array with one entry for each shared function (not just active, but all of them).
    2. Set each element of sfPEscape to 1.
    3. For s=each element in activeSFs
      a. For c=each component covered by s
        i. If c is in C, then multiply (1-sfcoverage(s, c)) into sfPEscape
    4. Return sfPEscape.

TABLE 1

| | Summary of notation |
|---|---|
| Φ | Set of components |
| Ψ | Set of tests |
| Ω | Set of shared functions |
| c | A component |
| t | A test |
| s | A shared function |
| C | A set of components, C ⊆ Φ |
| T | A set of tests, T ⊆ Ψ |
| S | A set of shared functions, S ⊆ Ω |
| π | The passed tests, π ⊆ Ψ |
| φ | The failed tests, φ ⊆ Ψ |
| sfcov(s, c) | Coverage of shared function s on component c |
| cov(t, c) | Coverage of test t on component c |
| sfused(t) | Set of shared functions used by test t |
| sfvar(s) | Variability of shared function s |
| sfprob(s) | Probability that a test t with s ∈ sfused(t) fails due to s failing |
| κ(A) | The set of configurations of a set of random variables A |
| N | Assumed maximum number of simultanenously failed components |
| M | Number of elements in a set partition |

TABLE 1-continued

Summary of notation

| | |
|---|---|
| ∋ | "Such that" |
| \|A\| | Cardinality of the Set A |
| Ā | Complement of set A |

TABLE 2

| Model | # components | # tests | # SFs | aSFs max | aSFs eff. avg. | SF expansion |
|---|---|---|---|---|---|---|
| Boise | 44 | 40 | 6 | 4 | 3.48 | 11.15 |
| Lynx3 | 53 | 67 | 3 | 3 | 1.94 | 3.83 |
| Cofxhfdf | 284 | 184 | 203 | 6 | 2.5 | 5.85 |

$$P(S \subseteq \Omega \text{ fail} | C \subseteq \Phi \text{ bad}, \overline{C} \text{ good}) = \prod_{s \in S} P(s \text{ fail} | C \subseteq \Phi \text{ bad}, \overline{C} \text{ good}) \quad (1)$$

$$P(s \in \Omega \text{ fail} | C \subseteq \Phi \text{ bad}, \overline{C} \text{ good}) = 1 - \prod_{c \in C} (1 - sfcov(s, c)) \quad (2)$$

$$= 1 - \prod_{\substack{c \in C \\ sfcov(s,c) \neq 0}} (1 - sfcov(s, c)) \quad (3)$$

$$P(T \subseteq \Psi \text{ fail} | C \text{ bad}, \overline{C} \text{ good}, S \text{ fail}, \overline{S} \text{ pass}) = \prod_{t \in \Psi} P(t \text{ fail} | C, \overline{C}, S, \overline{S}) \quad (4)$$

$$P(t \in \Psi \text{ fail} | C \subseteq \Phi \text{ bad}, \overline{C} \text{ good}) = 1 - \prod_{t \in C} (1 - cov(t, c)) \quad (5)$$

$$= 1 - \prod_{\substack{c \in C \\ cov(t,c) \neq 0}} (1 - cov(t, c)) \quad (6)$$

$$P(t \in \Psi \text{ passed} | C \subseteq \Phi \text{ bad}, \overline{C} \text{ good}, S \subseteq \Omega \text{ failed}, \overline{S} \text{ passed}) = \quad (7)$$
$$\prod_{c \in C} (1 - cov(t, c)) \prod_{s \in S \text{ fused}(t)} (1 - sfprob(s) P(s \text{ failed} | C, \overline{C}, S, \overline{S})))$$

$$P(t \in \Psi \text{ failed} | C \subseteq \Phi \text{ bad}, \overline{C} \text{ good}, S \subseteq \Omega \text{ failed}, \overline{S} \text{ passed}) = \quad (8)$$
$$1 - \prod_{c \in C} (1 - cov(t, c)) \prod_{s \in S \text{ fused}(t)} (1 - sfprob(s) P(s \text{ failed} | C, \overline{C}, S, \overline{S})))$$

$$P(C \text{ bad}, \overline{C} \text{ good} | \pi \text{ pass}, \phi \text{ fail}) = \frac{P(\pi \text{ pass}, \phi \text{ fail} | C, \overline{C}) P(C, \overline{C})}{P(\pi \text{ pass}, \phi \text{ fail})} \quad (9)$$

$$L(C \text{ bad}, \overline{C} \text{ good} | \pi, \phi) = P(\pi \text{ pass}, \phi \text{ fail} | C, \overline{C}) P(C, \overline{C}) \quad (10)$$

$$P(\pi, \phi | C, \overline{C}) = P(\pi \text{ pass} | C, \overline{C}) P(\phi \text{ fail} | C, \overline{C}) \quad (11)$$

$$P(\pi \text{ pass} | C, \overline{C}) = \prod_{t \in \pi} P(t \text{ pass} | C, \overline{C}) \quad (12)$$

$$= \prod_{t \in \pi} \prod_{c \in C} P(t \text{ pass} | c) \quad (13)$$

$$= \prod_{t \in \pi} \prod_{c \in C} (1 - cov(t, c)) \quad (14)$$

$$P(\phi \text{ fail} | C, \overline{C}) = \prod_{t \in \phi} P(t \text{ failed} | C, \overline{C}) \quad (15)$$

$$= \prod_{c \in \phi} \left( 1 - \prod_{c \in C} (1 - cov(t, c)) \right) \quad (16)$$

$$P(\pi, \phi | C, \overline{C}) = \sum_{(\sigma \text{ failed}, \overline{\sigma} \text{ passed}) \in \kappa(\Omega)} P(\pi, \phi | C, \overline{C}, \sigma, \overline{\sigma}) P(\sigma \text{ failed}, \overline{\sigma} \text{ passed} | C, \overline{C}) \quad (17)$$

$$P(\pi, \phi | C, \overline{C}, \sigma, \overline{\sigma}) = \prod_{t \in \pi} P(t \text{ passed} | C, \overline{C}, \sigma, \overline{\sigma}) \prod_{t \in \phi} P(t \text{ failed} | C, \overline{C}, \sigma, \overline{\sigma}) \quad (18)$$

$$P(\sigma \text{ fail}, \overline{\sigma} \text{ pass} | C, \overline{C}) = P(\sigma \text{ fail} | C, \overline{C}) P(\overline{\sigma} \text{ pass} | C, \overline{C}) \quad (19)$$

-continued $$P(\sigma \text{ fail} | C, \overline{C}) = \prod_{s \in \sigma}\left(1 - \prod_{c \in C}(1 - sfcov(s, c))\right) \quad (20)$$

$$P(\overline{\sigma} \text{ pass} | C, \overline{C}) = \prod_{s \in \pi}\prod_{c \in C}(1 - sfcov(s, c)) \quad (21)$$

$$\overline{\Omega} = \{s \in \overline{\Omega} | \exists c \in C \ni sfcov(s, c) > 0\} \quad (22)$$

$$P(C \text{ bad}, C \subseteq \Phi) = \prod_{c \in C} P(c \text{ bad}) \quad (0.1)$$

$$P(s \in \Omega \text{ failed} | c \in \Phi \text{ bad}) = sfcov(s, c) \quad (0.2)$$

$$P(t \in \Psi \text{ failed} | c \in \Phi \text{ bad}) = cov(t, c) \quad (3.1)$$

$$sfprob(t) = 1 - sfvar(t)/2 \quad (6.1)$$

$$(\sigma \text{ failed}, \overline{\sigma} \text{ passed}) \in \kappa(\overline{\Omega}) \quad (21.1)$$

$$\overline{\Omega} = \bigcup_{t \in \chi, \phi} sfused(t) \quad (22.1)$$

$$P(\pi, \phi | C, \overline{C}, \sigma, \overline{\sigma}) \quad (22.2)$$

$$P(\sigma \text{ failed}, \overline{\sigma} \text{ passed} | C, \overline{C}) \quad (22.3)$$

$$P(\sigma \text{ fail} | C, \overline{C}) = 0 \quad (22.4)$$

$$\prod_{c \in C}(1 - cov(t, c)) \quad (22.5)$$

What is claimed is:

1. An engine for diagnosing a device having a plurality of components, the engine comprising:
   a specifier arranged to specify a number N of components of the plurality of components that are capable of be simultaneously bad, N being a positive integer equal to or greater than 1, and
   a computer arranged to compute:
      a likelihood that each set of components of the plurality of components having a size less than or equal to N comprise the bad components, based on a model of test coverage of tests on the plurality of components of the device and information as to probabilistic dependencies between the tests;
      a probability of a particular set of components being bad and all other components being good, wherein the plurality of components have probabilistically independent states;
      a probability of a particular set of shared functions being failed and another particular set of shared functions being passed given that a particular set of components is bad, wherein the states of shared functions, applicable to test the functionality of some of the plurality of components in the same way, are probabilistically independent given component states;
      a probability of a particular set of tests being failed and another particular set of shared functions being passed given that a particular set of components is bad and all remaining components of the plurality of components are good, and given that a particular set of shared functions has failed and all remaining shared functions have passed, wherein states of tests applicable on the device are probabilistically independent given component and shared function states; and
      test results of a set of tests on the device wherein at least one of the set of tests has failed.

2. The engine of claim 1, further comprising:
   an output interface arranged to output, for one or more of the plurality of components, a probability that a component of the plurality of components is bad.

3. The engine of claim 1, further comprising:
   another specifier arranged to specify a default value for N components of the plurality of components that are capable of being simultaneously bad.

4. The engine of claim 1, wherein at least one state of each component of the plurality of components is either good or bad, and a state of each shared function is either passed or failed, and the state of each test is either passed or failed.

5. The engine of claim 1, further comprising a memory having a capacity required by the engine during a diagnosis that is less than the memory capacity needed to store the model and the memory capacity needed to store an output.

6. The engine of claim 1, wherein the computer is arranged to compute the failure probability based on the following equation:

$$L(C \text{ bad}, \overline{C} \text{ good} | \pi, \phi) = P(\pi \text{ pass}, \phi \text{ fail} | C, \overline{C}) P(C, \overline{C})$$

in combination with the following equations:

$$P(\pi, \phi | C, \overline{C}) = \sum_{(\sigma \text{ failed}, \overline{\sigma} \text{ passed}) \in \kappa(\Omega)} P(\pi, \phi | C, \overline{C}, \sigma, \overline{\sigma}) P(\sigma \text{ failed}, \overline{\sigma} \text{ passed} | C, \overline{C})$$

$$P(\pi, \phi | C, \overline{C}, \sigma, \overline{\sigma}) = \prod_{t \in \pi} P(t \text{ passed} | C, \overline{C}, \sigma, \overline{\sigma}) \prod_{t \in \phi} P(t \text{ failed} | C, \overline{C}, \sigma, \overline{\sigma})$$

$$P(\sigma \text{ fail}, \overline{\sigma} \text{ pass} | C, \overline{C}) = P(\sigma \text{ fail} | C, \overline{C}) P(\overline{\sigma} \text{ pass} | C, \overline{C})$$

$$P(\sigma \text{ fail} | C, \overline{C}) = \prod_{s \in \sigma}\left(1 - \prod_{c \in C}(1 - sfcov(s, c))\right)$$

$$P(\overline{\sigma} \text{ pass} | C, \overline{C}) = \prod_{s \in \overline{\sigma}}\prod_{c \in C}(1 - sfcov(s, c)).$$

7. The engine of claim 6, further comprising:
a memory arranged to store:
an accumulated a sum in accordance with the following equation:

$$P(\pi, \phi \mid C, \overline{C}) = \sum_{(\sigma \text{ failed}, \overline{\sigma} \text{ passed}) \in \kappa(\Omega)} P(\pi, \phi \mid C, \overline{C}, \sigma, \overline{\sigma}) P(\sigma \text{ failed}, \overline{\sigma} \text{ passed} \mid C, \overline{C})$$

accumulated products in accordance with the following equation:

$$P(\pi, \phi \mid C, \overline{C}, \sigma, \overline{\sigma}) = \prod_{t \in \pi} P(t \text{ passed} \mid C, \overline{C}, \sigma, \overline{\sigma}) \prod_{t \in \phi} P(t \text{ failed} \mid C, \overline{C}, \sigma, \overline{\sigma})$$

accumulated products in accordance with the following equation:

$$P(\sigma \text{ fail} \mid C, \overline{C}) = \prod_{s \in \sigma}\left(1 - \prod_{c \in C}(1 - sfcov(s, c))\right)$$

and accumulated products in accordance with the following equation:

$$P(\overline{\sigma} \text{ pass} \mid C, \overline{C}) = \prod_{s \in \overline{\sigma}} \prod_{c \in C}(1 - sfcov(s, c)).$$

8. The engine of claim 1, wherein the computer is arranged to further compute shared functions, the shared functions including Provisional Active Shared Functions and Active Shared Functions.

9. The engine of claim 8, wherein the computer is arranged to compute the shared functions in accordance with the following equation:

$$\hat{\Omega} = \{s \in \Omega \mid \exists c \in C \exists sfcov(s,c) > 0\}.$$

10. An engine for diagnosing a device having a plurality of components, the engine comprising:
a first specifier arranged to specify component a priori probabilities, coverages, and shared function coverages;
a second specifier arranged to specify which tests on the components of the device have passed or failed or which tests on the components of the device were not performed;
a third specifier arranged to specify a number N of components of the plurality of components that are capable of being simultaneously bad, N being a positive integer equal to or greater than 1, and
a computer arranged to compute:
a likelihood that each set of the plurality of components of a size less than or equal to N comprise the bad components of the plurality of components;
a probability of a particular set of components being bad and all remaining components of the plurality of components being good, wherein the plurality of components have probabilistically independent states;
a probability of a particular set of shared functions being failed and another particular set of shared functions being passed given that a particular set of components is bad, wherein states of shared functions, applicable to test the functionality of some of the plurality of components in the same way, are probabilistically independent given component states; and
a probability of a particular set of tests being failed and another particular set of shared functions being passed given that a particular set of components is bad and all remaining components are good, and given that a particular set of shared functions has failed and all remaining shared functions have passed, wherein states of tests applicable on the device are probabilistically independent given component and shared function states.

11. A method of diagnosing a device having a plurality of components, the method being performed on the basis of test results of a set of tests on the plurality of components of the device wherein at least one test has failed and the number N of components that are capable of being simultaneously bad, N being a positive integer equal to or greater than 1 and with the aide of a model giving the coverage of tests on the plurality of components of the device and information as to probabilistic dependencies between the tests, the method comprising computing:
a likelihood that each set of the plurality of components having a size less than or equal to N comprise the bad components of said plurality of components;
a probability of any particular set of components of the plurality of components being bad and all remaining components of the plurality of components being good, wherein states of the plurality of components are probabilistically independent;
a probability of any particular set of shared functions being failed and another particular set of shared functions being passed given that a particular set of components of said plurality of components are bad, wherein states of shared functions, applicable to test functionality of some components of said plurality of components in the same way, are probabilistically independent given component states; and
a probability of any particular set of tests being failed and another particular set of shared functions being passed given that a particular set of components of said plurality of components are bad, and remaining components of said plurality of components are good, and a particular set of shared functions are failed, and remaining sets of shared functions are passed, wherein states of tests applicable on the device are probabilistically independent given component and shared function states.

12. An engine for diagnosing a device having a plurality of components, the engine comprising:
a specifier arranged to specify a number N of components of the plurality of components that are capable of being simultaneously bad, N being a positive integer equal to or greater than 1; and
a computer arranged to compute:
a likelihood that each set of components of the plurality of components having a size less than or equal to N comprise the bad components, based on a model of the test coverage of tests on the plurality of components of the device and information as to probabilistic dependencies between the tests;
a probability of a particular set of components of the plurality of components being bad and all remaining components of the plurality of components being good, wherein the plurality of components have probabilistically independent states;

a probability of a particular set of tests being failed given that a particular set of components of said plurality of components is bad, and all remaining components of the plurality of components are good, wherein the states of tests applicable to the device are probabilistically independent given component states; and test results of a set of tests on the device wherein at least one test has failed.

13. A computer program product comprising:

a computer usable medium having computer readable program code means embodied in said medium to perform a method of diagnosing a device having a plurality of components, the method being performed on the basis of test results of a set of tests on the plurality of components of the device wherein at least one test has failed and the number N of components that are capable of being simultaneously bad, N being a positive integer equal to or greater than 1 and with the aide of a model giving the coverage of tests on the plurality of components of the device and information as to probabilistic dependencies between the tests, the computer program product having:

a computer readable program code means for receiving test results of a set of tests on the device wherein at least one test has failed;

a computer readable program code means for receiving a model giving the coverage of tests on the plurality of components of the device and information as to probabilistic dependencies between the tests;

a computer readable program code means for computing:

a likelihood that each set of the plurality of components having a size less than or equal to N comprise the bad components of said plurality of components;

a probability of any particular set of components of the plurality of components being bad and all remaining components of the plurality of components being good, wherein states of the plurality of components are probabilistically independent;

a probability of any particular set of shared functions being failed and another particular set of shared functions being passed given that a particular set of components of said plurality of components are bad, wherein states of shared functions, applicable to test functionality of some components of said plurality of components in the same way, are probabilistically independent given component states; and a probability of any particular set of tests being failed and another particular set of shared functions being passed given that a particular set of components of said plurality of components are bad, and remaining components of said plurality of components are good, and a particular set of shared functions are failed, and remaining sets of shared functions are passed, wherein states of tests applicable on the device are probabilistically independent given component and shared function states.

14. A program storage device readable by a machine, tangibly embodying a program of instructions executable by the machine to perform a method of diagnosing a device having a plurality of components, the method being performed on the basis of test results of a set of tests on the plurality of components of the device wherein at least one test has failed and the number N of components that are capable of being simultaneously bad, N being a positive integer equal to or greater than 1 and with the aide of a model giving the coverage of tests on the plurality of components of the device and information as to probabilistic dependencies between the tests, the method comprising computing:

a likelihood that each set of the plurality of components having a size less than or equal to N comprise the bad components of said plurality of components;

a probability of any particular set of components of the plurality of components being bad and all remaining components of the plurality of components being good, wherein states of the plurality of components are probabilistically independent;

a probability of any particular set of shared functions being failed and another particular set of shared functions being passed given that a particular set of components of said plurality of components are bad, wherein states of shared functions, applicable to test functionality of some components of said plurality of components in the same way, are probabilistically independent given component states; and a probability of any particular set of tests being failed and another particular set of shared functions being passed given that a particular set of components of said plurality of components are bad, and remaining components of said plurality of components are good, and a particular set of shared functions are failed, and remaining sets of shared functions are passed, wherein states of tests applicable on the device are probabilistically independent given component and shared function states.

15. An article of manufacture for use in a computer system for performing a method of diagnosing a device having a plurality of components, the method being performed on the basis of test results of a set of tests on the plurality of components of the device wherein at least one test has failed and the number N of components that are capable of being simultaneously bad, N being a positive integer equal to or greater than 1 and with the aide of a model giving the coverage of tests on the plurality of components of the device and information as to probabilistic dependencies between the tests, said article of manufacture comprising a computer usable medium having a computer readable program code means embodied in said medium including:

a computer readable program code means embodied in said computer usable medium for computing:

a likelihood that each set of the plurality of components having a size less than or equal to N comprise the bad components of said plurality of components;

a probability of any particular set of components of the plurality of components being bad and all remaining components of the plurality of components being good, wherein states of the plurality of components are probabilistically independent;

a probability of any particular set of shared functions being failed and another particular set of shared functions being passed given that a particular set of components of said plurality of components are bad, wherein states of shared functions, applicable to test functionality of some components of said plurality of components in the same way, are probabilistically independent given component states; and a probability of any particular set of tests being failed and another particular set of shared functions being passed given that a particular set of components of said plurality of components are bad, and remaining components of said plurality of components are good, and a particular set of shared functions are failed, and remaining sets of shared functions are passed, wherein states of tests applicable on the device are probabilistically independent given component and shared function states.

* * * * *